(12) United States Patent
Osada et al.

(10) Patent No.: US 7,999,016 B2
(45) Date of Patent: Aug. 16, 2011

(54) SEMICONDUCTOR ENCAPSULATING EPOXY RESIN COMPOSITION AND SEMICONDUCTOR DEVICE

(75) Inventors: Shoichi Osada, Gunma-ken (JP); Eiji Nakayama, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 530 days.

(21) Appl. No.: 11/193,351

(22) Filed: Aug. 1, 2005

(65) Prior Publication Data

US 2006/0025501 A1 Feb. 2, 2006

(30) Foreign Application Priority Data

Aug. 2, 2004 (JP) ................. 2004-225584
Aug. 24, 2004 (JP) ................. 2004-243316
Jul. 8, 2005 (JP) ................. 2005-200137

(51) Int. Cl.
*C08K 5/00* (2006.01)
*H01L 21/00* (2006.01)

(52) U.S. Cl. ..................... 523/457; 438/127

(58) Field of Classification Search .............. 523/457; 438/127
See application file for complete search history.

(56) References Cited

U.S. PATENT DOCUMENTS

| 5,391,446 | A * | 2/1995 | Ohtani et al. | 430/59.6 |
| 2003/0166757 | A1 * | 9/2003 | Nishihara et al. | 524/430 |
| 2004/0006168 | A1 * | 1/2004 | Wagner et al. | 524/405 |
| 2004/0013911 | A1 * | 1/2004 | Maeda | 428/702 |
| 2006/0241215 | A1 * | 10/2006 | Osada et al. | 523/457 |
| 2006/0241250 | A1 * | 10/2006 | Osada et al. | 525/481 |

FOREIGN PATENT DOCUMENTS

| JP | 6-51826 | B2 | 7/1994 |
| JP | 2501820 | B2 | 3/1996 |
| JP | 2519277 | B2 | 5/1996 |
| JP | 9-118810 | A | 5/1997 |
| JP | 2712898 | B2 | 10/1997 |
| JP | 10-158360 | A | 6/1998 |
| JP | 10-259292 | A | 9/1998 |
| JP | 2843244 | B2 | 10/1998 |
| JP | 10-292094 | A | 11/1998 |
| JP | 11-12438 | A | 1/1999 |
| JP | 11-240937 | A | 9/1999 |
| JP | 11-310766 | A | 11/1999 |
| JP | 2000-159520 | A | 6/2000 |
| JP | 2000-204227 | A | 7/2000 |
| JP | 2000-230110 | A | 8/2000 |
| JP | 3167853 | B2 | 3/2001 |
| JP | 2002-80566 | A | 3/2002 |
| JP | 2002-275358 | A | 9/2002 |
| JP | 2003-138102 | A | 5/2003 |

OTHER PUBLICATIONS

Iwai, H.; Ohmi, S.; Akama, S.; Ohshima, C.; Kashiwagi, I.; Kikuchi, A.; Taguchi, J.; Yamamoto, H.; Ueda, I.; Kuriyama, A.; Tonotani, J.; Kim, Y.; Yoshihara, Y.; Ishiwara, H. "Hight Dielectric Constant Gate Insulator Technology Using Rare Earth Oxides." Sym. on VLSI Tec. 2000. 2001, IEDM 200, 2001, IWGI 2001 (2001).*
Kamisawa et al., "Research on effective use of rare-earth elements," Special Research Reports of Agency of Industrial Science and Technology Ministry of International Trade and Industry, Japan, 2000, vol. 2000, pp. 380-385.

* cited by examiner

*Primary Examiner* — Mark Eashoo
*Assistant Examiner* — Megan McCulley
(74) *Attorney, Agent, or Firm* — Birch, Stewart, Kolasch & Birch, LLP

(57) ABSTRACT

Epoxy resin compositions comprising (A) an epoxy resin, (B) a phenolic resin curing agent, (C) an inorganic filler, (D) a rare earth oxide, and optionally (E) a phosphazene compound cure into products having improved heat resistance and moisture-proof reliability and are best suited for the encapsulation of semiconductor devices.

7 Claims, No Drawings

SEMICONDUCTOR ENCAPSULATING EPOXY RESIN COMPOSITION AND SEMICONDUCTOR DEVICE

CROSS-REFERENCE TO RELATED APPLICATION

This non-provisional application claims priority under 35 U.S.C. §119(a) on Patent Application Nos. 2004-225584 and 2004-243316 filed in Japan on Aug. 2, 2004 and Aug. 24, 2004, respectively, the entire contents of which are hereby incorporated by reference.

This invention relates to an epoxy resin composition for semiconductor encapsulation which cures into a product having heat resistance and moisture-proof reliability. It also relates to a semiconductor device encapsulated with a cured product of the composition.

BACKGROUND OF THE INVENTION

The current mainstream of semiconductor devices resides in diodes, transistors, ICs, LSIs and VLSIs of the resin encapsulation type. Epoxy resins have superior moldability, adhesion, electrical properties, mechanical properties, and moisture resistance to other thermosetting resins. It is thus a common practice to encapsulate semiconductor devices with epoxy resin compositions. While modern automobiles are equipped with electronic control systems, semiconductor devices are employed around automobile engines where they are frequently exposed to elevated temperatures. It is required to insure device operation at elevated temperatures.

In semiconductor encapsulating epoxy resin compositions, halogenated epoxy resins combined with antimony trioxide ($Sb_2O_3$) are often included in order to enhance flame retardance. This combination of a halogenated epoxy resin with antimony trioxide has great radical-trapping and air-shielding effects in the vapor phase, thus conferring a high fire-retarding effect.

However, when a semiconductor device encapsulated with an encapsulant comprising a halogenated epoxy resin and antimony trioxide is exposed to elevated temperatures for a long period of time, halide ions promote formation of metal compounds in the joint areas between gold wires and aluminum pads on the silicon chip, detracting from mechanical strength and electrical properties.

Under these circumstances, studies have been conducted on the use of hydroxides such as $Al(OH)_3$ and $Mg(OH)_2$ or phosphorus-based fire retardants such as red phosphorus and phosphates in place of halogenated epoxy resins and antimony trioxide. Unfortunately, various problems arise from the use of these alternative compounds. The hydroxides such as $Al(OH)_3$ and $Mg(OH)_2$ have less flame retardant effects and must be added in larger amounts in order that epoxy resin compositions be flame retardant. Then the viscosity of these compositions increases to a deleterious level to molding, causing molding defects such as voids and wire flow. On the other hand, the phosphorus-based fire retardants such as red phosphorus and phosphates added to epoxy resin compositions can be hydrolyzed to generate phosphoric acid when the semiconductor devices are exposed to hot humid conditions. The phosphoric acid generated causes aluminum conductors to be corroded, detracting from reliability.

Compositions comprising an epoxy resin and a curing agent cure into products which can be thermally degraded to generate organic acids such as acetic acid and formic acid, giving negative impact on the reliability of semiconductor devices. Then, resin compositions having a low epoxy equivalent, a high aromatic ring content and good thermal stability as well as high flame retardance are used. However, their cured products have a low glass transition temperature (Tg), and thus exhibit less satisfactory electrical properties at temperatures higher than the Tg because ionic impurities become more active or mobile.

It would be desirable if semiconductor-encapsulating epoxy resin compositions cure into products which have improved heat-resistant reliability and moisture-proof reliability in that ionic impurities become less during high-temperature, long-term storage. It was proposed to add hydrotalcite compounds to the compositions for the purposes of trapping or scavenging ionic impurities and neutralizing the acidity of cured compositions. See Japanese Patent Nos. 2,501,820, 2,519,277, 2,712,898, and 3,167,853, JP-B 6-051826, JP-A 9-118810, JP-A 10-158360, JP-A 11-240937, JP-A 11-310766, JP-A 2000-159520, JP-A 2000-230110, and JP-A 2002-080566. The hydrotalcite compounds, however, fail to overcome the problem of epoxy resin compositions having added thereto phosphorus-based flame retardants such as phosphazene compounds that the phosphorus-based flame retardants are decomposed to generate phosphoric acid when semiconductor devices are exposed to high temperatures. That is, there is a certain limit for the hydrotalcite compounds to completely convert the phosphoric acid into a non-detrimental form.

Japanese Patent No. 2,843,244 proposes an epoxy resin composition using a flame retardant having red phosphorus coated with a surface layer of $Si_xO_y$, although it still lacks moisture-proof reliability. JP-A 10-259292 discloses an epoxy resin composition in which a cyclic phosphazene compound is used in an amount to give 0.2-3.0% by weight of phosphorus atoms based on the total weight of other components excluding the filler. To provide flame retardance, a substantial amount of the cyclic phosphazene compound must be added to the epoxy resin composition, which can cause ineffective cure and a lowering of electrical resistance in a high-temperature environment. Although the cyclic phosphazene compound is relatively stable to heat, long-term exposure to high temperatures can cause the phosphazene compound to be decomposed to generate phosphoric acid, giving negative impact to the high-temperature operation of semiconductor devices.

Further, JP-A 2003-138102 discloses a semiconductor encapsulating, flame retardant epoxy resin composition comprising as essential components, (A) an epoxy resin, (B) a curing agent, (C) an inorganic filler, (D) a molybdenum ingredient having zinc molybdate supported on an inorganic filler, and (E) a phosphazene compound having the average compositional formula (i):

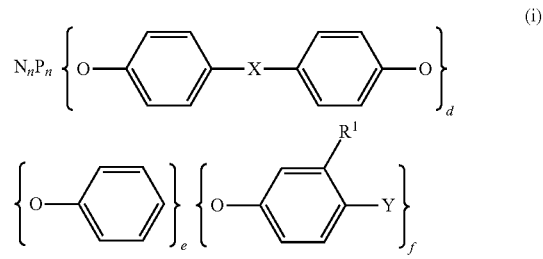

wherein X is a single bond or a group selected from among $CH_2$, $C(CH_3)_2$, $SO_2$, S, O, and $O(CO)O$, Y is OH, SH or $NH_2$, $R^1$ is a group selected from among $C_1$-$C_4$ alkyl and alkoxy groups, $NH_2$, $NR^2R^3$ and $SR^4$, wherein each of $R^2$, $R^3$ and $R^4$ is a hydrogen atom or an $C_1$-$C_4$ alkyl group, subscripts d, e, f and n are numbers satisfying $0 \leq d \leq 0.25n$, $0 \leq e < 2n$, $0 \leq f \leq 2n$, $2d+e+f=2n$, and $3 \leq n \leq 1000$. This epoxy resin composition is free of bromides such as brominated epoxy resins and antimony compounds such as antimony trioxide, is effectively moldable, and cures into a product having improved flame retardance and moisture-proof reliability. However, it does not overcome the problem of epoxy resin compositions having phosphorus-based flame retardants such as phosphazene compounds added thereto that the phosphorus-based flame retardants can be decomposed to generate phosphoric acid compounds having negative impact on the reliability of semiconductor devices, when semiconductor devices are exposed to high temperatures.

SUMMARY OF THE INVENTION

An object of the invention is to provide an epoxy resin composition for semiconductor encapsulation which cures into a product having improved heat resistance and moisture-proof reliability.

Another object is to provide a flame retardant epoxy resin composition for semiconductor encapsulation which is effectively moldable and cures into a product having improved flame retardance and moisture-proof reliability despite the absence of bromides (e.g., brominated epoxy resins) and antimony compounds (e.g., antimony trioxide).

A further object is to provide a semiconductor device encapsulated with the cured epoxy resin composition.

The inventors have discovered that a semiconductor encapsulating epoxy resin composition comprising (A) an epoxy resin, (B) a phenolic resin curing agent, (C) an inorganic filler, and (D) a rare earth oxide as essential components cures into a product having improved heat resistance and moisture-proof reliability. More specifically, the inventors have discovered that rare earth oxides have an ability to trap or scavenge impurity ions and when added to epoxy resin compositions, serve to control the propagation of impurity ions generating at high temperatures and maintain an ion trapping ability even under hot humid conditions, offering moisture-proof reliability.

The inventors have also discovered that a semiconductor encapsulating epoxy resin composition comprising the foregoing components (A) to (D) and (E) a phosphazene compound of the average compositional formula (1), shown below, is effectively moldable and cures into a product having improved heat resistance, flame retardance and moisture-proof reliability despite the substantial absence of bromides and antimony compounds.

Accordingly, the present invention in one aspect provides a semiconductor encapsulating epoxy resin composition comprising (A) an epoxy resin,
(B) a phenolic resin curing agent in an amount to provide 0.5 to 1.5 moles of phenolic hydroxyl groups per mole of epoxy groups in the epoxy resin (A),
(C) an inorganic filler in an amount of 400 to 1,200 parts by weight per 100 parts by weight of components (A) and (B) combined, and
(D) a rare earth oxide in an amount of 0.5 to 20 parts by weight per 100 parts by weight of components (A) and (B) combined.

Also contemplated herein is a semiconductor device encapsulated with a cured product of the epoxy resin composition.

The semiconductor encapsulating epoxy resin composition of the invention cures into a product having improved heat resistance and moisture-proof reliability. Thus the semiconductor device encapsulated with the cured epoxy resin composition has improved heat resistance and moisture-proof reliability.

In this case, the rare earth oxide (D) is preferably present in an amount of 2 to 10 parts by weight per 100 parts by weight of components (A) and (B) combined. The epoxy resin composition may further comprise a curing accelerator in an amount of 0.1 to 5 parts by weight per 100 parts by weight of components (A) and (B) combined. The epoxy resin composition may also comprise a parting agent in an amount of 0.1 to 5 parts by weight per 100 parts by weight of components (A) and (B) combined. The epoxy resin composition may also comprise a silane coupling agent in an amount of 0.1 to 5 parts by weight per 100 parts by weight of components (A) and (B) combined.

In another aspect, the present invention provides a semiconductor encapsulating, flame retardant epoxy resin composition comprising (A) an epoxy resin,
(B) a phenolic resin curing agent in an amount to provide 0.5 to 1.5 moles of phenolic hydroxyl groups per mole of epoxy groups in the epoxy resin (A),
(C) an inorganic filler in an amount of 400 to 1,200 parts by weight per 100 parts by weight of components (A), (B) and (E) combined,
(D) a rare earth oxide in an amount of 0.5 to 20 parts by weight per 100 parts by weight of components (A), (B) and (E) combined, and
(E) a phosphazene compound of the average compositional formula (1) in an amount of 1 to 50% by weight based on the total weight of components (A), (B) and (E).

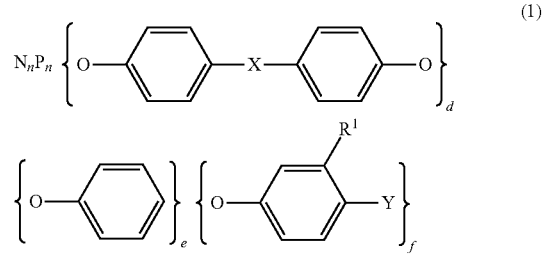

Herein X is a single bond or a group selected from among $CH_2$, $C(CH_3)_2$, $SO_2$, S, O, and $O(CO)O$, Y is OH, SH or $NH_2$, $R^1$ is a group selected from among $C_1$-$C_4$ alkyl and alkoxy groups, $NH_2$, $NR^2R^3$ and $SR^4$, wherein each of $R^2$, $R^3$ and $R^4$ is a hydrogen atom or $C_1$-$C_4$ alkyl group, d, e, f and n are numbers satisfying $0 \leq d \leq 0.25n$, $0 \leq e \leq 2n$, $0 \leq f \leq 2n$, $2d+e+f=2n$, and $3 \leq n \leq 1,000$.

Also contemplated herein is a semiconductor device encapsulated with a cured product of the epoxy resin composition.

In this case, the epoxy resin composition may further comprise a curing accelerator in an amount of 0.1 to 5 parts by weight per 100 parts by weight of components (A), (B) and (E) combined. The epoxy resin composition may also comprise a parting agent in an amount of 0.1 to 5 parts by weight per 100 parts by weight of components (A), (B) and (E) combined. The epoxy resin composition may also comprise a silane coupling agent in an amount of 0.1 to 5 parts by weight per 100 parts by weight of components (A), (B) and (E) combined.

The use of (E) phosphazene compound in combination with (D) rare earth oxide offers high flame retardance despite the substantial absence of bromides and antimony compounds.

As stated above, the epoxy resin composition of the invention is substantially free of bromides and antimony compounds. Although brominated epoxy resins and antimony trioxide are generally included in conventional epoxy resin compositions in order to impart flame retardance thereto, the epoxy resin composition of the invention clears the flame retardant specifications, UL-94, V-0 without resorting to brominated epoxy resins and antimony trioxide.

In the prior art, studies were conducted on the use of hydroxides such as $Al(OH)_3$ and $Mg(OH)_2$ or phosphorus-based fire retardants such as red phosphorus and phosphates in place of the brominated epoxy resins and antimony trioxide. Unfortunately, these known alternative flame retardants have the common drawback that they are less resistant to water, especially at elevated temperatures, so that they are dissolved and decomposed to increase impurity ions in the extracting water. As a consequence, if semiconductor devices encapsulated with conventional flame retardant epoxy resin compositions substantially free of bromides and antimony compounds are kept in a hot humid environment for a long period of time, the aluminum conductors in the devices can be corroded, detracting from moisture-proof reliability.

Addressing the above concerns, we have discovered that a semiconductor encapsulating epoxy resin composition using both (D) a rare earth oxide as an ion trapping agent and (E) a phosphazene compound of the average compositional formula (1) as a flame retardant does not increase impurity ions in the extracting water, is effectively moldable and cures into a product having improved heat resistance, flame retardance and moisture-proof reliability. The phosphazene compound of formula (1) is fully resistant to heat and water and will release relatively less impurity ions such as phosphate ions in the extracting water. However, when exposed to high temperatures of 150° C. to 200° C. for a long period of time, the phosphazene compound can be partially decomposed to generate phosphoric acids. In this regard, the rare earth oxide (D) has an ability to trap phosphate ions and has no impact on the curability of the composition because no rare earth metal is leached out. The semiconductor encapsulating epoxy resin composition of the invention is effectively moldable and cures into a product having improved heat resistance, flame retardance and moisture-proof reliability. Absent bromides (e.g., brominated epoxy resins) and antimony compounds (e.g., antimony trioxide), the epoxy resin compositions of the invention eliminate any negative impact on human health and the environment.

DETAILED DESCRIPTION OF THE INVENTION

The semiconductor encapsulating epoxy resin composition of the invention comprises (A) an epoxy resin, (B) a phenolic resin curing agent, (C) an inorganic filler, (D) a rare earth oxide and optionally and preferably (E) a phosphazene compound.

[(A) Epoxy Resin]

Component (A) in the epoxy resin composition of the invention is an epoxy resin which is not critical. Illustrative examples of suitable epoxy resins include novolac type epoxy resins, cresol novolac type epoxy resins, triphenolalkane type epoxy resins, aralkyl type epoxy resins, biphenyl skeleton-containing aralkyl type epoxy resins, biphenyl type epoxy resins, dicyclopentadiene type epoxy resins, heterocyclic epoxy resins, naphthalene ring-containing epoxy resins, bisphenol A type epoxy compounds, bisphenol F type epoxy compounds, and stilbene type epoxy resins. These epoxy resins may be employed alone or in combination of two or more. Of these, aromatic ring-containing epoxy resins are preferred. Brominated epoxy resins are excluded.

The epoxy resin used herein preferably has a hydrolyzable chlorine content of up to 1,000 ppm, especially up to 500 ppm and sodium and potassium contents of up to 10 ppm for each. If the content of hydrolyzable chlorine is more than 1,000 ppm or if the content of sodium or potassium is more than 10 ppm, moisture resistance may degrade when the encapsulated semiconductor device is long held in a hot humid environment.

[(B) Curing Agent]

Component (B) is a phenolic resin curing agent which is not critical as well. Illustrative examples of typical phenolic resin curing agents include phenolic novolac resins, naphthalene ring-containing phenolic resins, aralkyl type phenolic resins, triphenolalkane type phenolic resins, biphenyl skeleton-containing aralkyl type phenolic resins, biphenyl type phenolic resins, alicyclic phenolic resins, heterocyclic phenolic resins, naphthalene ring-containing phenolic resins, and bisphenol-type phenolic resins such as bisphenol A and bisphenol F type phenolic resins. These phenolic resins may be employed alone or in combination of two or more.

Like the epoxy resin, the curing agent used herein preferably has sodium and potassium contents of up to 10 ppm for each. If the content of sodium or potassium is more than 10 ppm, moisture resistance may degrade when the encapsulated semiconductor device is long held in a hot humid environment.

The phenolic resin curing agent is used in such amounts that the molar ratio of phenolic hydroxyl groups in the curing agent to epoxy groups in the epoxy resin is from 0.5 to 1.5, and preferably from 0.8 to 1.2. A molar ratio of less than 0.5 or more than 1.5 corresponds to a biased balance between epoxy groups and phenolic hydroxyl groups, resulting in cured products having unsatisfactory properties.

[(C) Inorganic Filler]

The inorganic filler (C) included in the epoxy resin compositions of the invention may be any suitable inorganic filler commonly used in epoxy resin compositions. Illustrative examples include silicas such as fused silica and crystalline silica, alumina, silicon nitride, aluminum nitride, boron nitride, titanium oxide, and glass fibers.

No particular limit is imposed on the mean particle size and shape of these inorganic fillers. To enhance the flame retardance, the inorganic filler is preferably contained in the epoxy resin composition in a larger amount insofar as this does not compromise moldability. With respect to the mean particle size and shape of the inorganic filler, spherical fused silica having a mean particle size of 5 to 30 μm is especially preferred. The amount of the inorganic filler (C) loaded is preferably 400 to 1,200 parts, more preferably 500 to 1,000 parts by weight per 100 parts by weight of components (A), (B), and (E) combined, although component (E) may not be blended in the composition, i.e., the amount of component (E) is 0 part by weight (the following is interpreted in the same way). A composition with less than 400 pbw of the inorganic filler may have an increased coefficient of linear expansion, allowing more stresses to be applied to the semiconductor devices. A composition with more than 1,200 pbw of the inorganic filler may be less flowable and difficult to mold.

It is noted that the mean particle size can be determined as the weight average value or median diameter by the laser light diffraction technique, for example.

The inorganic filler used herein is preferably surface treated beforehand with a coupling agent such as a silane coupling agent or a titanate coupling agent in order to increase the bonding strength between the resin and the inorganic filler. The preferred coupling agents are silane coupling agents including epoxy silanes such as γ-glycidoxypropyltrimethoxysilane, γ-glycidoxypropylmethyldiethoxysilane, and β-(3,4-epoxycyclohexyl)ethyltrimethoxysilane; amino silanes such as N-β-(aminoethyl)-γ-aminopropyltrimethoxysilane, the reaction product of imidazole with γ-glycidoxypropyltrimethoxysilane, γ-aminopropyltriethoxysilane, and N-phenyl-γ-aminopropyltrimethoxysilane; and mercapto silanes such as γ-mercaptosilane and γ-episulfidoxypropyltrimethoxysilane. No particular limitation is imposed on the amount of coupling agent used for surface treatment or the method of surface treatment.

[(D) Rare Earth Oxide]

Component (D) is a rare earth oxide having an ability to trap ions, especially phosphate ions. Even when the rare earth oxide is kept under hot humid conditions, no metal ions such as La, Y, Gd, Bi, Mg or Al ions are leached out. The rare earth oxide does not affect the curability of epoxy resin compositions. Thus cured products having improved heat resistance and moisture resistance are obtainable.

Examples of the rare earth oxide include lanthanum oxide, gadolinium oxide, samarium oxide, thulium oxide, europium oxide, neodymium oxide, erbium oxide, terbium oxide, praseodymium oxide, dysprosium oxide, yttrium oxide, ytterbium oxide, and holmium oxide.

The rare earth oxide is added in an amount of 0.5 to 20 parts by weight per 100 parts by weight of components (A), (B) and (E) combined, preferably 1 to 10 parts by weight when component (E) is included, and more preferably 2 to 10 parts by weight per 100 parts by weight of components (A), (B) and (E) combined. Less than 0.5 pbw of the rare earth oxide may fail to exert the desired ion trapping effect whereas more than 20 pbw of the rare earth oxide may detract from fluidity.

[(E) Phosphazene Compound]

In a preferred embodiment of the semiconductor encapsulating epoxy resin composition of the invention, (E) a phosphazene compound of the average compositional formula (1) is compounded.

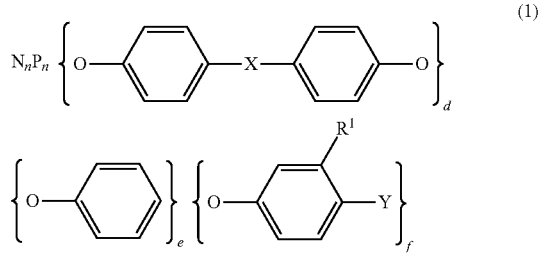

(1)

Herein X is a single bond or a group selected from among $CH_2$, $C(CH_3)_2$, $SO_2$, S, O, and $O(CO)O$, Y is OH, SH or $NH_2$, $R^1$ is a group selected from among $C_1$-$C_4$ alkyl and alkoxy groups, $NH_2$, $NR^2R^3$ and $SR^4$, wherein each of $R^2$, $R^3$ and $R^4$ is a hydrogen atom or $C_1$-$C_4$ alkyl group, d, e, f and n are numbers satisfying $0 \geq d \geq 0.25n$, $0 \geq e \geq 2n$, $0 \geq f \geq 2n$, $2d+e+f=2n$, and $3 \geq n \geq 1,000$.

As compared with epoxy resin compositions having added thereto phosphorus-based flame retardants such as red phosphorus and phosphate esters, the flame retardant epoxy resin composition of the invention having added thereto the phosphazene compound of formula (1) cures into a product having improved hot water extraction properties and moisture-proof reliability.

In formula (1), n is in the range of 3 to 1,000, and preferably 3 to 10. For synthesis, n=3 is most preferred.

The proportion of d, e and f is to satisfy $0 \geq d \geq 0.25n$, $0 \geq e \geq 2n$, $0 \geq f \geq 2n$, and $2d+e+f=2n$. If $0.25n < d$, then the phosphazene compound has a higher softening point due to more intermolecular crosslinks, and thus becomes less miscible with the epoxy resin, failing to achieve the desired flame retarding effects. The proportion of d is preferably $0 \geq d \geq 0.15n$.

X, Y and $R^1$ are as defined above. $R^1$ is an electron donative group. Without substitution with an electron donative group, Y becomes less nucleophilic so that the phosphazene compound becomes less reactive with epoxy groups. If the amount of the phosphazene compound of formula (1) added is increased, there can occur a loss of curability and a lowering of electric resistance at high temperatures. Poor curability leads to a likelihood of thermal decomposition, which in turn, leads to a loss of flame retardance. If $R^1$ is an alkyl or alkoxy group having 5 or more carbon atoms, flame retardance lowers as the number of carbon atoms increases. $R^1$ is thus preferably a methyl, methoxy, amino or dimethylamino group.

It is understood that when X is a single bond,

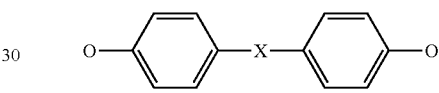

is represented as

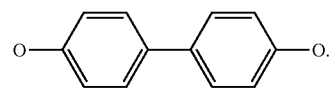

The phosphazene compound (E) is added in an amount of 1 to 50% by weight, preferably 2 to 20% by weight, based on the total weight of components (A), (B) and (E). Less than 1% by weight of the phosphazene compound may fail to provide the desired flame retarding effect whereas more than 50% by weight may detract from fluidity.

[(F) Other Components]

The semiconductor encapsulating epoxy resin compositions of the invention may further include various additives, typically components (a) to (e), if necessary and as long as the objects of the invention are not impaired.

(a) Curing Accelerator

In the practice of the invention, a curing accelerator is preferably used to promote the curing reaction between the epoxy resin and the curing agent. The curing accelerator may be any suitable substance that promotes the curing reaction. Illustrative, non-limiting examples of curing accelerators that may be used include phosphorus compounds such as triphenylphosphine, tributylphosphine, tri(p-methylphenyl)phosphine, tri(nonylphenyl)phosphine, triphenylphosphine triphenylborane, tetraphenylphosphine tetraphenylborate, and the addition product of triphenylphosphine and p-benzoquinone; tertiary amine compounds such as triethylamine, benzyldimethylamine, α-methylbenzyldimethylamine, and 1,8-diazabicyclo[5.4.0]undecene-7; and imidazole compounds such as 2-ethyl-4-methylimidazole, 2-methylimidazole, 2-phenylimidazole, and 2-phenyl-4-methylimidazole.

The curing accelerator is blended in an effective amount to promote the curing reaction between the epoxy resin and the curing agent, desirably in an amount of 0.1 to 5 parts, more desirably 0.5 to 2 parts by weight per 100 parts by weight of components (A), (B), and (E) combined, independent of whether it is a phosphorus compound, tertiary amine compound or imidazole compound as stated above. Less than 0.1 pbw of the curing accelerator may result in under-curing whereas more than 5 pbw may promote fast curing, leaving unfilled voids.

(b) Parting Agent

Parting agents which can be used herein include carnauba wax, rice wax, polyethylene, polyethylene oxide, montanic acid, and montan waxes in the form of esters of montanic acid with saturated alcohols, 2-(2-hydroxyethylamino)ethanol, ethylene glycol, glycerin or the like; stearic acid, stearate esters, stearamides, ethylene bisstearamide, ethylene-vinyl acetate copolymers, and the like, alone or in admixture of two or more.

The parting agent is desirably included in an amount of 0.1 to 5 parts, more desirably 0.3 to 4 parts by weight per 100 parts by weight of components (A), (B) and (E) combined.

(c) Silane Coupling Agent

Any prior art well-known silane coupling agents may be added to the epoxy resin composition for improving the compatibility between components.

Examples of suitable silane coupling agents include γ-glycidoxypropyltrimethoxysilane, γ-glycidoxypropylmethyldiethoxysilane, γ-glycidoxypropyltriethoxysilane, p-styryltrimethoxysilane, γ-methacryloxypropylmethyldimethoxysilane, γ-methacryloxypropyltrimethoxysilane, γ-methacryloxypropylmethyldiethoxysilane, γ-methacryloxypropyltriethoxysilane, γ-acryloxypropyltrimethoxysilane, N-β-(aminoethyl)-γ-aminopropylmethyldimethoxysilane, N-β-(aminoethyl)-γ-aminopropyltrimethoxysilane, N-β-(aminoethyl)-γ-aminopropyltriethoxysilane, γ-aminopropyltriethoxysilane, γ-aminopropyltrimethoxysilane, N-phenyl-γ-aminopropyltrimethoxysilane, γ-mercaptopropylmethyldimethoxysilane, γ-mercaptopropyltrimethoxysilane, bis(triethoxypropyl)tetrasulfide, and γ-isocyanatopropyltriethoxysilane. These compounds may be used alone or in admixture of two or more. Of these, γ-glycidoxypropyltrimethoxysilane is most preferred because epoxy resin composition having improved moisture-proof reliability and minimized loss of adhesive strength after moisture absorption and deterioration.

The coupling agent is desirably included in an amount of 0.1 to 5 parts, more desirably 0.3 to 3 parts by weight per 100 parts by weight of components (A), (B) and (E) combined.

(d) Other Flame Retardant and Ion Trapping Agent

In the semiconductor encapsulating epoxy resin compositions of the invention, there may be added other flame retardants, for example, phosphorus-based flame retardants such as red phosphorus and phosphate esters, hydroxides such as aluminum hydroxide and magnesium hydroxide, inorganic compounds such as zinc borate, zinc stannate, and zinc molybdate; and other ion-trapping agents, for example, hydrotalcite compounds, zirconium phosphates and bismuth hydroxides. It is understood that antimony compounds such as antimony trioxide are excluded.

The other flame retardant is desirably included in an amount of 3 to 50 parts, more desirably 5 to 20 parts by weight per 100 parts by weight of components (A), (B) and (E) combined.

Other ion trapping agents which can be used herein include those described in Japanese Patent Nos. 2,501,820, 2,519,277, 2,712,898, and 3,167,853, JP-B 6-051826, JP-A 9-118810, JP-A 10-158360, JP-A 11-240937, JP-A 11-310766, JP-A 2000-159520, JP-A 2000-230110, and JP-A 2002-080566. Of these, preferred are hydrotalcite compounds of the following general formula:

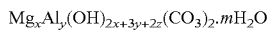

$$Mg_xAl_y(OH)_{2x+3y+2z}(CO_3)_z \cdot mH_2O$$

wherein x, y and z satisfy $0<y/x \leq 1$ and $0 \leq z/y < 1.5$, and m is an integer. They are often used as the ion trapping agent in many semiconductor encapsulating materials.

The hydrotalcite compound is desirably included in an amount of 1 to 30 parts, more desirably 2 to 5 parts by weight per 100 parts by weight of components (A), (B) and (E) combined.

(e) Others

The semiconductor encapsulating epoxy resin compositions of the invention may include various other additives. Examples include stress reducing agents such as thermoplastic resins, thermoplastic elastomers, organic synthetic rubbers, and silicones; colorants such as carbon black; and halogen trapping agents.

The inventive epoxy resin compositions may be prepared as a molding material by compounding the epoxy resin, curing agent, inorganic filler, rare earth oxide and optional additives in predetermined proportions, thoroughly mixing these components together in a mixer or other appropriate apparatus, then melting and working the resulting mixture using a hot roll mill, kneader, extruder or the like. The worked mixture is then cooled and solidified, and subsequently ground to a suitable size so as to give a molding material.

The resulting epoxy resin compositions of the invention can be effectively used for encapsulating various types of semiconductor devices. The method of encapsulation most commonly used is low-pressure transfer molding. The epoxy resin composition of the invention is preferably molded at a temperature of about 150 to 180° C. for a period of about 30 to 180 seconds, followed by post-curing at about 150 to 180° C. for about 2 to 16 hours.

EXAMPLE

Examples of the invention and Comparative Examples are given below together with synthesis examples of phosphazene compounds, for further illustrating the invention, but are not intended to limit the invention. All parts are by weight. Me is methyl.

Synthesis Example A

In a nitrogen atmosphere and at 0° C., 8.6 g (214 mmol) of sodium hydride was suspended in 50 ml of THF. To the suspension, 19.8 g (211 mmol) of phenol in 75 ml of THF was added dropwise. After 30 minutes of stirring, 12.0 g (34.5 mmol) of hexachlorotriphosphazene in 75 ml of THF was added dropwise, and the resulting solution was heated under reflux for 18 hours. The solvent was distilled off in vacuum, after which methanol was added. Crystals precipitated and were washed with methanol and water, yielding 23.8 g of white crystals.

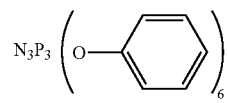

Synthesis Example B

In a nitrogen atmosphere and at 0° C., 4.6 g (114 mmol) of sodium hydride was suspended in 50 ml of THF. To the suspension, a solution of 9.7 g (104 mmol) phenol and 0.40 g (1.7 mmol) 4,4'-sulfonyldiphenol in 50 ml THF was added dropwise. After 30 minutes of stirring, a solution of 12.5 g (36.0 mmol) hexachlorotriphosphazene in 50 ml THF was added dropwise, and the resulting solution was heated under reflux for 5 hours. The solvent was distilled off in vacuum, after which 150 ml of cyclohexane and 57.3 g (345 mmol) of methylhydroquinone were added. To the solution, 27.3 g (345 mmol) of pyridine was added dropwise. The solution was heated under reflux for 18 hours. The lower layer in yellow syrup form was decanted, dissolved in 80 ml of 80% acetic acid and poured into 500 ml of water whereupon crystals precipitated. The crystals were dissolved in methanol and poured into water whereupon crystals precipitated again. This procedure was repeated until the water became neutral. There was obtained 25.8 g of brown crystals.

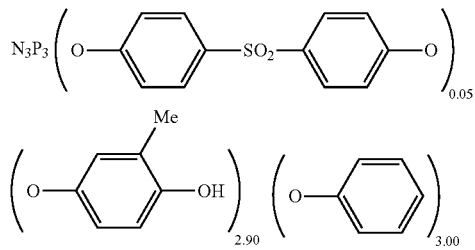

Examples 1-7 & Comparative Examples 1-4

Epoxy resin compositions for semiconductor encapsulation were prepared by uniformly melt mixing the components shown in Tables 1 and 2 in a hot twin-roll mill, followed by cooling and grinding. Properties (i) to (iv) of these compositions were measured by the following methods. The results are shown in Tables 3 and 4.

(i) Fluidity

Spiral flow was measured by molding at 175° C. and 6.9 N/mm$^2$ for a molding time of 120 seconds using a mold in accordance with EMMI standards.

(ii) Ionic Impurities in Extracting Water

A disk having a diameter of 50 mm and a thickness of 3 mm was molded from the epoxy resin composition at a temperature of 175° C. and a pressure of 6.9 N/mm$^2$ for a time of 90 seconds and post-cured for 4 hours at 180° C. The disk was held in a 175° C. atmosphere for 1,000 hours, following which it was ground on a disk mill into particles having a particle size of 63 to 212 μm. A 10 g portion of the particles was added to 50 ml of deionized water, with which soluble ionic impurities were extracted at 125° C. for 20 hours. The filtrate was measured for Cl, $PO_4$, $NO_3$, HCOO and $CH_3COO$ ion concentration by ion chromatography and metal (La, Y, Gd, Bi, Mg, and Al) ion concentration by inductively coupled plasma-Auger electron spectroscopy (ICP-AES).

(iii) Heat Resistance

A silicon chip measuring 6×6 mm on which aluminum wiring had been formed at a width of 5 μm and a space of 5 μm was adhesively bonded to a 14-pin dual in-line package (DIP) frame (Alloy 42), and the aluminum electrodes on the chip surface were wire bonded to the lead frame using gold wire having a diameter of 25 μm. The epoxy resin composition was then molded over the chip at a temperature of 175° C. and a pressure of 6.9 N/mm$^2$ for a time of 120 seconds, and post-cured at 180° C. for 4 hours. Twenty packages thus obtained were left to stand for 1,000 hours in an atmosphere of 175° C. while being subjected to a bias voltage of −5 V DC. Their resistance values were measured, from which an average was computed.

(iv) Moisture Resistance

A silicon chip measuring 6×6 mm on which aluminum wiring had been formed at a width of 5 μm and a space of 5 μm was adhesively bonded to a 14-pin DIP frame (Alloy 42), and the aluminum electrodes on the chip surface were wire bonded to the lead frame using gold wire having a diameter of 25 μm. The epoxy resin composition was then molded over the chip at a temperature of 175° C. and a pressure of 6.9 N/mm$^2$ for a time of 120 seconds, and post-cured at 180° C. for 4 hours. Twenty packages thus obtained were left to stand for 500 hours in an atmosphere of 130° C. and RH 85% while being subjected to a bias voltage of −20 V DC. The number of packages in which aluminum corrosion arose was counted.

TABLE 1

| | Formulation (pbw) | | Example | | | | | | |
|---|---|---|---|---|---|---|---|---|---|
| | | | 1 | 2 | 3 | 4 | 5 | 6 | 7 |
| A | Epoxy resin EOCN 1020-55 | | 59 | | | | 59 | 59 | 59 |
| | Epoxy resin NC-3000 | | | 58 | 58 | 58 | | | |
| B | Phenolic resin curing agent DL-92 | | 41 | | | | 36 | 36 | 36 |
| | Phenolic resin curing agent MEH-7851SS | | | 42 | 42 | 42 | | | |
| C | Spherical fused silica | | 600 | 600 | 600 | 600 | 600 | 600 | 580 |
| | Lanthanum (III) oxide | | 5 | 5 | | | 5 | 0.5 | 20 |
| | Yttrium (III) oxide | | | | 5 | | | | |
| | Gadolinium (III) oxide | | | | | 5 | | | |
| F | Ion trapping agent | IXE-500 | | | | | | | |
| | | DHT-4A-2 | | | | | | | |
| | Flame retardant | SPE-100 | | | | | 5 | 5 | 5 |
| | Curing accelerator | triphenylphosphine | 1.0 | 1.0 | 1.0 | 1.0 | 1.0 | 1.0 | 1.0 |
| | Parting agent | carnauba wax | 1.5 | 1.5 | 1.5 | 1.5 | 1.5 | 1.5 | 1.5 |
| | Carbon black | Denka Black | 1.5 | 1.5 | 1.5 | 1.5 | 1.5 | 1.5 | 1.5 |
| | Silane coupling agent | KBM-403 | 1.0 | 1.0 | 1.0 | 1.0 | 1.0 | 1.0 | 1.0 |

TABLE 2

| Formulation | | Comparative Example | | | | |
|---|---|---|---|---|---|---|
| (pbw) | | 1 | 2 | 3 | 4 | 5 |
| A | Epoxy resin EOCN 1020-55 | 59 | 59 | | | 59 |
| | Epoxy resin NC-3000 | | | 58 | 58 | |
| B | Phenolic resin curing agent DL-92 | 41 | 41 | | | 36 |
| | Phenolic resin curing agent MEH-7851SS | | | 42 | 42 | |
| C | Spherical fused silica | 600 | 575 | 600 | 600 | 600 |
| D | Lanthanum (III) oxide | | 25 | | | |
| | Yttrium (III) oxide | | | | | |
| | Gadolinium (III) oxide | | | | | |
| F | Ion trapping agent IXE-500 | | | | | 5 |
| | DHT-4A-2 | | | | 5 | |
| | Flame retardant SPE-100 | | | | | 5 |
| | Curing accelerator triphenylphosphine | 1.0 | 1.0 | 1.0 | 1.0 | 1.0 |
| | Parting agent carnauba wax | 1.5 | 1.5 | 1.5 | 1.5 | 1.5 |

TABLE 2-continued

| Formulation | | Comparative Example | | | | |
|---|---|---|---|---|---|---|
| (pbw) | | 1 | 2 | 3 | 4 | 5 |
| Carbon black | Denka Black | 1.5 | 1.5 | 1.5 | 1.5 | 1.5 |
| Silane coupling agent | KBM-403 | 1.0 | 1.0 | 1.0 | 1.0 | 1.0 |

A. Epoxy resin o-cresol novolac epoxy resin EOCN 1020-55 by Nippon Kayaku K. K. (epoxy equivalent 200) biphenyl-containing aralkyl type epoxy resin NC-3000 by Nippon Kayaku K. K. (epoxy equivalent 272)

B. Curing agent phenol novolac resin DL-92 by Meiwa Kasei K. K. (phenolic hydroxyl equivalent 110) biphenyl-containing aralkyl type phenolic resin MEH-7851SS by Meiwa Kasei K. K. (phenolic hydroxyl equivalent 175)

C. Inorganic filler:

spherical fused silica (mean particle size 20 μm) by Tatsumori K. K.

D. Rare earth oxide:

lanthanum (III) oxide (by Shin-Etsu Chemical Co., Ltd.), yttrium (III) oxide (by Shin-Etsu Chemical Co., Ltd.), gadolinium (III) oxide (by Shin-Etsu Chemical Co., Ltd.), F. Additives:

Ion trapping agent:

IXE-500 $(BiO(OH)_{0.7}(NO_3)_{0.3})$ by Toa Synthesis Co., Ltd.
DHT-4A-2 (hydrotalcite) by Kyowa Chemical Co., Ltd.

Flame retardant:

phosphazene SPE-100 by Otsuka Chemical Co., Ltd.

Curing accelerator:

triphenyl phosphine by Hokko Chemical K. K.

Parting agent:

carnauba wax by Nikko Fine Products K. K.

Carbon black:

Denka Black by Denki Kagaku Kogyo K. K.

Silane coupling agent:

KBM-403 (γ-glycidoxypropyltrimethoxysilane) by Shin-Etsu Chemical Co., Ltd.

TABLE 3

| Test results | | Example | | | | | | |
|---|---|---|---|---|---|---|---|---|
| | | 1 | 2 | 3 | 4 | 5 | 6 | 7 |
| Fluidity (inch) | | 40 | 60 | 61 | 59 | 42 | 44 | 30 |
| In extracting water | Cl ions (ppm) | <5 | <5 | <5 | <5 | <5 | 8 | <5 |
| | PO₄ ions (ppm) | <5 | <5 | <5 | <5 | <5 | <5 | <5 |
| | NO₃ ions (ppm) | <5 | <5 | <5 | <5 | <5 | <5 | <5 |
| | HCOO ions (ppm) | 14 | 8 | 10 | 12 | 11 | 19 | <5 |
| | CH₃COO ions (ppm) | <5 | <5 | <5 | <5 | <5 | 9 | <5 |
| | La ions (ppm) | <5 | <5 | — | — | <5 | <5 | <5 |
| | Y ions (ppm) | — | — | <5 | — | — | — | — |
| | Gd ions (ppm) | — | — | — | <5 | — | — | — |
| | Bi ions (ppm) | — | — | — | — | — | — | — |
| | Mg ions (ppm) | — | — | — | — | — | — | — |
| | Al ions (ppm) | — | — | — | — | — | — | — |
| Heat resistance (Ω) | | 16 | 16 | 16 | 16 | 16 | 16 | 16 |
| Moisture resistance | | 0/20 | 0/20 | 0/20 | 0/20 | 0/20 | 1/20 | 0/20 |

TABLE 4

| Test results | | Comparative Example | | | | |
|---|---|---|---|---|---|---|
| | | 1 | 2 | 3 | 4 | 5 |
| Fluidity (inch) | | 45 | 28 | 60 | 62 | 44 |
| In extracting water | Cl ions (ppm) | 12 | <5 | <5 | 8 | 15 |
| | PO₄ ions (ppm) | <5 | <5 | <5 | <5 | 80 |
| | NO₃ ions (ppm) | <5 | <5 | 40 | <5 | <5 |
| | HCOO ions (ppm) | 65 | <5 | <5 | 31 | 62 |
| | CH₃COO ions (ppm) | 26 | <5 | <5 | 10 | 37 |
| | La ions (ppm) | — | <5 | — | — | — |
| | Y ions (ppm) | — | — | — | — | — |
| | Gd ions (ppm) | — | — | — | — | — |
| | Bi ions (ppm) | — | — | — | — | — |
| | Mg ions (ppm) | — | — | — | 61 | — |
| | Al ions (ppm) | — | — | — | 31 | — |
| Heat resistance (Ω) | | 25 | 16 | ∞ (broken) | 16 | 16 |
| Moisture resistance | | 14/20 | 0/20 | 0/20 | 7/20 | 20/20 |

It is evident from Tables 3 and 4 that the semiconductor encapsulating epoxy resin compositions within the scope of the invention contain less ionic impurities and cure into products having improved heat resistance and moisture-proof reliability, and that semiconductor devices encapsulated with the cured epoxy resin compositions are improved in heat resistance and moisture-proof reliability.

Examples 8-12 & Comparative Examples 6-9

Epoxy resin compositions for semiconductor encapsulation were prepared by uniformly melt mixing the components shown in Table 5 in a hot twin-roll mill, followed by cooling and grinding. Properties (i) to (v) of these compositions were measured by the following methods. The results are also shown in Table 5.

(i) Hardness when Molded

In accordance with JIS-K6911, a rod measuring 10×4×100 mm was molded from the epoxy resin composition at a temperature of 175° C. and a pressure of 6.9 N/mm² for a time of 90 seconds. The hardness when hot was measured by a Barcol Impressor.

(ii) Flame Retardance

A sheet of 1.5875 mm (1/16 inch) thick was molded from the epoxy resin composition at 175° C. and 6.9 N/mm² for 120 seconds and post cured at 180° C. for 4 hours. Its flame retardance was rated in accordance with UL-94 burning test specifications.

(iii) Ionic Impurities in Extracting Water

A disk having a diameter of 50 mm and a thickness of 3 mm was molded from the epoxy resin composition at 175° C. and 6.9 N/mm² for 90 seconds and post-cured for 4 hours at 180° C. The disk was held in a 175° C. atmosphere for 1,000 hours, following which it was ground on a disk mill into particles having a particle size of 63 to 212 μm. A 10 g portion of the particles was added to 50 ml of deionized water, with which soluble ionic impurities were extracted at 125° C. for 20 hours. The filtrate was measured for phosphate ion concentration by ion chromatography and metal ion concentration by ICP-AES.

(iv) Moisture Resistance

A silicon chip measuring 6×6 mm on which aluminum wiring had been formed at a width of 5 μm and a space of 5 μm was adhesively bonded to a 14-pin DIP frame (Alloy 42), and the aluminum electrodes on the chip surface were wire bonded to the lead frame using gold wire having a diameter of 25 μm. The epoxy resin composition was then molded over the chip at a temperature of 175° C. and a pressure of 6.9 N/mm² for a time of 120 seconds, and post-cured at 180° C. for 4 hours. Twenty packages thus obtained were left to stand for 500 hours in an atmosphere of 130° C. and RH 85% while being subjected to a bias voltage of −20 V DC. The number of packages in which aluminum corrosion arose was counted.

(v) Heat Resistance

A silicon chip measuring 6×6 mm on which aluminum wiring had been formed at a width of 5 μm and a space of 5 μm was adhesively bonded to a 14-pin DIP frame (Alloy 42), and the aluminum electrodes on the chip surface were wire bonded to the lead frame using gold wire having a diameter of 25 μm. The epoxy resin composition was then molded over the chip at 175° C. and 6.9 N/mm² for 120 seconds, and post-cured at 180° C. for 4 hours. Twenty packages thus obtained were left to stand for 1,000 hours in an atmosphere of 175° C. while being subjected to a bias voltage of −5 V DC. Their resistance values were measured, from which an average was computed.

TABLE 5

| | Formulation | | Example | | | | | Comparative Example | | | |
|---|---|---|---|---|---|---|---|---|---|---|---|
| | (pbw) | | 8 | 9 | 10 | 11 | 12 | 6 | 7 | 8 | 9 |
| A | Epoxy resin EOCN1020-55 | | 59 | 59 | 59 | 59 | 57 | 59 | 57 | 54 | 62 |
| B | Phenolic resin curing agent DL-92 | | 33 | 33 | 33 | 33 | 23 | 33 | 23 | 38 | 38 |
| C | Spherical fused silica | | 600 | 600 | 600 | 600 | 600 | 600 | 600 | 600 | 600 |
| E | Phosphazene of Synthesis Example A | | 8 | 8 | 8 | 8 | | 8 | | | |
| | Phosphazene of Synthesis Example B | | | | | | 20 | | 20 | | |
| D | Gadolinium (III) oxide | | 3 | | | 6 | 3 | | | | 6 |
| | Yttrium (III) oxide | | | 3 | | | | | | | |
| | Lanthanum (III) oxide | | | | 3 | | | | | | |
| F | Flame retardant | Red phosphorus | | | | | | | | | 2 |
| | | Brominated epoxy resin | | | | | | | | 8 | |
| | | Antimony trioxide | | | | | | | | 10 | |
| | Curing accelerator | triphenyl-phosphine | 1.0 | 1.0 | 1.0 | 1.0 | 1.0 | 1.0 | 1.0 | 1.0 | 1.0 |
| | Parting agent | carnauba wax | 1.5 | 1.5 | 1.5 | 1.5 | 1.5 | 1.5 | 1.5 | 1.5 | 1.5 |
| | Carbon black | Denka Black | 1.5 | 1.5 | 1.5 | 1.5 | 1.5 | 1.5 | 1.5 | 1.5 | 1.5 |
| | Silane coupling agent | KBM-403 | 1.0 | 1.0 | 1.0 | 1.0 | 1.0 | 1.0 | 1.0 | 1.0 | 1.0 |
| Test Results | Hardness when molded | | 85 | 85 | 85 | 85 | 88 | 85 | 88 | 86 | 85 |
| | Flame retardance | | V-0 | V-0 | V-0 | V-0 | V-0 | V-0 | V-0 | V-0 | V-0 |
| | Phosphate ions in extracting water (ppm) | | <5 | <5 | <5 | <5 | <5 | 55 | 110 | <5 | 350 |
| | Metal ions in extracting water (ppm) | | <5 | <5 | <5 | <5 | <5 | <5 | <5 | <5 | <5 |
| | Moisture resistance | | 0/20 | 0/20 | 0/20 | 0/20 | 0/20 | 5/20 | 11/20 | 0/20 | 20/20 |
| | Heat resistance (Ω) | | 16 | 16 | 16 | 16 | 16 | 22 | 31 | ∞ Broken | 40 |

A. Epoxy resin
o-cresol novolac epoxy resin EOCN 1020-55 by Nippon Kayaku K. K. (epoxy equivalent 200)
B. Curing agent
phenol novolac resin DL-92 by Meiwa Kasei K. K. (phenolic hydroxyl equivalent 110)
C. Inorganic filler:
spherical fused silica (mean particle size 20 μm) by Tatsumori K. K.
D. Rare earth oxide:
lanthanum (III) oxide (by Shin-Etsu Chemical Co., Ltd.),
yttrium (III) oxide (by Shin-Etsu Chemical Co., Ltd.),
gadolinium (III) oxide (by Shin-Etsu Chemical Co., Ltd.),
F. Additives:
Curing accelerator:
triphenyl phosphine by Hokko Chemical K. K.
Parting agent:
carnauba wax by Nikko Fine Products K. K. Carbon black:
Denka Black by Denki Kagaku Kogyo K. K.
Silane coupling agent:
KBM-403 (γ-glycidoxypropyltrimethoxysilane) by Shin-Etsu Chemical Co., Ltd.

It is evident from Table 5 that the semiconductor encapsulating epoxy resin compositions within the scope of the invention are effectively moldable and cure into products having improved heat resistance, flame retardance and moisture-proof reliability, and that semiconductor devices encapsulated with the cured epoxy resin compositions are improved in heat resistance, flame retardance and moisture-proof reliability. Since bromides (e.g., brominated epoxy resins) and antimony compounds (e.g., antimony trioxide) are absent, the epoxy resin compositions of the invention have no negative impact on human health and the environment.

Japanese Patent Application Nos. 2004-225584 and 2004-243316 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A semiconductor encapsulating, flame retardant epoxy resin composition comprising
   (A) a non-brominated aromatic ring-containing epoxy resin selected from the group consisting of novolac type epoxy resins, cresol novolac type epoxy resins, triphenolalkane type epoxy resins, aralkyl type epoxy resins, biphenyl skeleton-containing aralkyl type epoxy resins, biphenyl type epoxy resins, naphthalene ring-containing epoxy resins, bisphenol A type epoxy compounds, bisphenol F type epoxy compounds, and stilbene type epoxy resins,
   (B) a phenolic resin curing agent in an amount to provide 0.5 to 1.5 moles of phenolic hydroxyl groups per mole of epoxy groups in the epoxy resin (A),
   (C) an inorganic filler in an amount of 400 to 1,200 parts by weight per 100 parts by weight of components (A), (B) and (E) combined,
   (D) a rare earth oxide in an amount of 2 to 10 parts by weight per 100 parts by weight of components (A) and (B) combined, wherein said rare earth oxide (D) is selected from the class consisting of lanthanum oxide, gadolinium oxide, yttrium oxide, and mixtures thereof, and
   (E) a flame retardant compound consisting of a phosphazene compound, in an amount of 2 to 20% by weight based on the total weight of components (A), (B) and (E) combined, wherein said phosphazene compound has the average compositional formula (1):

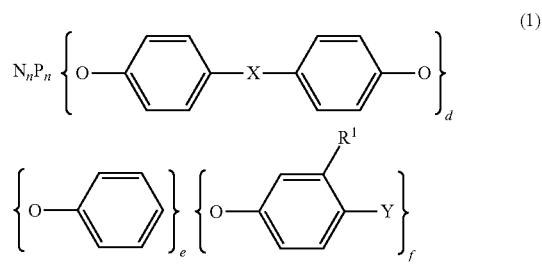

wherein X is a single bond or a group selected from among $CH_2$, $C(CH_3)_2$, $SO_2$, $S$, $O$, and $O(CO)O$, Y is OH, SH or $NH_2$, $R^1$ is a group selected from among $C_1$-$C_4$ alkyl and alkoxy groups, $NH_2$, $NR^2R^3$ and $SR^4$, wherein each of $R^2$, $R^3$ and $R^4$ is a hydrogen atom or $C_1$-$C_4$ alkyl group, d, e, f and n are numbers satisfying $0 \leq d \leq 0.25n$, $0 \leq e \leq 2n$, $0 \leq f \leq 2n$, $2d+e+f=2n$, and $3 \leq n \leq 1,000$.

2. The epoxy resin composition of claim 1 which is substantially free of bromides and antimony compounds.

3. The epoxy resin composition of claim 1 further comprising a curing accelerator in an amount of 0.1 to 5 parts by weight per 100 parts by weight of components (A), (B) and (E) combined.

4. The epoxy resin composition of claim 1 further comprising a parting agent in an amount of 0.1 to 5 parts by weight per 100 parts by weight of components (A), (B) and (E) combined.

5. The epoxy resin composition of claim 1 further comprising a silane coupling agent in an amount of 0.1 to 5 parts by weight per 100 parts by weight of components (A), (B) and (E) combined.

6. The epoxy resin composition of claim 1, wherein said epoxy resin has a sodium content of up to 10 ppm, a potassium content of up to 10 ppm, and a hydrolyzable chlorine content of up to 1000 ppm.

7. A semiconductor device encapsulated with an epoxy resin composition comprising
   (A) a non-brominated aromatic ring-containing epoxy resin selected from the group consisting of novolac type epoxy resins, cresol novolac type epoxy resins, triphenolalkane type epoxy resins, aralkyl type epoxy resins, biphenyl skeleton-containing aralkyl type epoxy resins, biphenyl type epoxy resins, naphthalene ring-containing epoxy resins, bisphenol A type epoxy compounds, bisphenol F type epoxy compounds, and stilbene type epoxy resins,
   (B) a phenolic resin curing agent in an amount to provide 0.5 to 1.5 moles of phenolic hydroxyl groups per mole of epoxy groups in the epoxy resin (A),
   (C) an inorganic filler in an amount of 400 to 1,200 parts by weight per 100 parts by weight of components (A), (B) and (E) combined, (D) a rare earth oxide in an amount of 2 to 10 parts by weight per 100 parts by weight of components (A) and (B) combined, wherein said rare earth oxide (D) is selected from the class consisting of lanthanum oxide, gadolinium oxide, yttrium oxide, and mixtures thereof, and (E) a flame retardant compound consisting of a phosphazene compound, in an amount of 2 to 20% by weight based on the total weight of components (A), (B) and (E) combined, wherein said phosphazene compound has the average compositional formula (1):

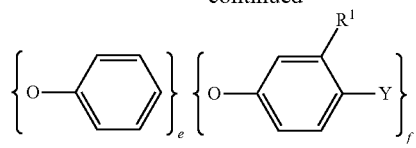
(1)

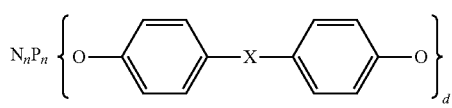

wherein X is a single bond or a group selected from among $CH_2$, $C(CH_3)_2$, $SO_2$, S, O, and $O(CO)O$, Y is OH, SH or $NH_2$, $R^1$ is a group selected from among $C_1$-$C_4$ alkyl and alkoxy groups, $NH_2$, $NR^2R^3$ and $SR^4$, wherein each of $R^2$, $R^3$ and $R^4$ is a hydrogen atom or $C_1$-$C_4$ alkyl group, d, e, f and n are numbers satisfying $0 \leq d \leq 0.25n$, $0 \leq e \leq 2n$, $0 \leq f \leq 2n$, $2d+e+f=2n$, and $3 \leq n \leq 1{,}000$
in a cured state.

* * * * *